US012298809B2

(12) United States Patent
Carnevali et al.

(10) Patent No.: US 12,298,809 B2
(45) Date of Patent: May 13, 2025

(54) HEATING MODULE FOR ELECTRONIC DEVICE DOCK AND METHODS OF MAKING AND USING

(71) Applicant: National Products, Inc., Seattle, WA (US)

(72) Inventors: Jeffrey D. Carnevali, Seattle, WA (US); Scott Anderson, Seattle, WA (US)

(73) Assignee: National Products, Inc., Seattle, WA (US)

( * ) Notice: Subject to any disclaimer, the term of this patent is extended or adjusted under 35 U.S.C. 154(b) by 201 days.

(21) Appl. No.: 18/218,381

(22) Filed: Jul. 5, 2023

(65) Prior Publication Data

US 2025/0013262 A1    Jan. 9, 2025

(51) Int. Cl.
  G06F 1/16    (2006.01)
  B60R 11/02   (2006.01)
  H05K 7/20    (2006.01)

(52) U.S. Cl.
  CPC ........ G06F 1/1632 (2013.01); B60R 11/0252 (2013.01); H05K 7/20172 (2013.01)

(58) Field of Classification Search
  None
  See application file for complete search history.

(56) References Cited

U.S. PATENT DOCUMENTS

| 809,977 A | 1/1906 | O'Brien |
|---|---|---|
| 1,786,459 A | 7/1926 | Simons |
| 2,495,552 A | 1/1950 | Schmitz |
| 2,549,917 A | 4/1951 | Millbrandt |
| 2,565,939 A | 8/1951 | Wriston |
| 2,612,947 A | 10/1952 | Jenks |
| 2,717,093 A | 9/1955 | Mautner |
| 2,803,368 A | 8/1957 | Koch |

(Continued)

FOREIGN PATENT DOCUMENTS

| CN | 1312603 | 9/2001 |
|---|---|---|
| CN | 101674096 | 3/2010 |

(Continued)

OTHER PUBLICATIONS

U.S. Appl. No. 18/590,837, filed Feb. 28, 2024.

(Continued)

*Primary Examiner* — Xanthia C Relford
*Assistant Examiner* — Xanthia C Cunningham
(74) *Attorney, Agent, or Firm* — Branch Partners PLLC; Bruce E. Black

(57) ABSTRACT

A dock for an electronic device includes a base configured to fit over at least a portion of a back surface of the electronic device, the base including a back surface and defining a first opening through the base; a tray extending from the base; and a heater module coupled, or coupleable, to the back surface of the base over the first opening. The heater module includes a fan to draw air to generate an air flow through the first opening of the base, a heating element to heat the drawn air, a temperature sensor coupled, or coupleable, to the base to monitor a temperature of the dock, the electronic device, or the heated air, and a processor configured to turn the fan and the heating element on or off in response to a temperature monitored by the temperature sensor.

20 Claims, 4 Drawing Sheets

(56) References Cited

U.S. PATENT DOCUMENTS

| | | |
|---|---|---|
| 3,018,525 A | 1/1962 | Deisenroth |
| 3,140,883 A | 7/1964 | Anthony |
| 3,464,579 A | 9/1969 | Asenbauer |
| 3,667,648 A | 6/1972 | Koziol |
| 3,885,701 A | 5/1975 | Becklin |
| 3,972,459 A | 8/1976 | Cooper |
| 3,978,830 A | 9/1976 | Toth, Jr. |
| 4,298,204 A | 11/1981 | Jinkins |
| 4,564,880 A | 1/1986 | Christ et al. |
| 4,607,772 A | 7/1986 | Hancock |
| 4,828,558 A | 5/1989 | Kelman |
| 4,842,174 A | 6/1989 | Sheppard et al. |
| 4,848,319 A | 7/1989 | Appeldorn |
| 5,002,184 A | 3/1991 | Lloyd |
| 5,052,943 A | 10/1991 | Davis |
| 5,096,317 A | 3/1992 | Phillippe |
| 5,135,189 A | 8/1992 | Ghazizadeh |
| 5,246,133 A | 9/1993 | James |
| 5,272,771 A | 12/1993 | Ansell et al. |
| 5,295,602 A | 3/1994 | Swanson |
| 5,353,934 A | 10/1994 | Yamauchi |
| 5,457,745 A | 10/1995 | Wang |
| 5,535,274 A | 7/1996 | Braitberg et al. |
| 5,584,054 A | 12/1996 | Tyneski et al. |
| 5,586,002 A | 12/1996 | Notarianni |
| 5,641,065 A | 6/1997 | Owens et al. |
| 5,646,649 A | 7/1997 | Iwata et al. |
| 5,791,506 A | 8/1998 | Sheffler et al. |
| 5,813,096 A | 9/1998 | Soennichsen |
| 5,822,427 A | 10/1998 | Braitberg et al. |
| 5,842,670 A | 12/1998 | Nigoghosian |
| 5,845,885 A | 12/1998 | Carnevali |
| 5,860,550 A | 1/1999 | Miller et al. |
| 5,888,087 A | 3/1999 | Hanson et al. |
| 5,895,018 A | 4/1999 | Rielo |
| 5,953,795 A | 9/1999 | Bauer |
| 5,969,057 A | 10/1999 | Schoeley et al. |
| 5,990,874 A | 11/1999 | Tsumura et al. |
| 5,992,807 A | 11/1999 | Tarulli |
| 6,009,601 A | 1/2000 | Kaufman |
| 6,010,005 A | 1/2000 | Reames et al. |
| 6,032,910 A | 3/2000 | Richter |
| 6,034,505 A | 3/2000 | Arthur et al. |
| 6,035,800 A | 3/2000 | Clifford |
| 6,043,626 A | 3/2000 | Snyder et al. |
| 6,068,119 A | 5/2000 | Derr et al. |
| 6,149,116 A | 11/2000 | Won |
| 6,191,943 B1 | 2/2001 | Tracy |
| 6,229,893 B1 | 5/2001 | Chen |
| 6,273,773 B1 | 8/2001 | Bourke |
| 6,276,552 B1 | 8/2001 | Vervisch |
| 6,295,198 B1 | 9/2001 | Loh et al. |
| 6,341,218 B1 | 1/2002 | Poplawsky et al. |
| 6,356,053 B1 | 3/2002 | Sandoz et al. |
| 6,377,825 B1 | 4/2002 | Kennedy et al. |
| 6,392,882 B1 | 5/2002 | Chen et al. |
| 6,406,758 B1 | 6/2002 | Bottari et al. |
| 6,407,860 B1 | 6/2002 | Funazaki et al. |
| 6,438,229 B1 | 8/2002 | Overy et al. |
| 6,561,476 B2 | 5/2003 | Carnevali |
| 6,572,176 B2 | 6/2003 | Davies et al. |
| 6,585,212 B2 | 7/2003 | Carnevali |
| 6,588,637 B2 | 7/2003 | Gates et al. |
| 6,597,924 B1 | 7/2003 | Smith |
| 6,614,423 B1 | 9/2003 | Wong et al. |
| 6,646,864 B2 | 11/2003 | Richardson |
| 6,648,376 B2 | 11/2003 | Christianson |
| 6,687,516 B2 | 2/2004 | Chen |
| 6,702,604 B1 | 3/2004 | Moscovitch |
| 6,754,343 B2 | 6/2004 | Lundstrom et al. |
| 6,762,585 B2 | 7/2004 | Liao |
| 6,776,422 B1 | 8/2004 | Toy |
| 6,785,566 B1 | 8/2004 | Irizarry |
| 6,785,567 B2 | 8/2004 | Kato |
| 6,816,713 B2 | 11/2004 | Chen |
| 6,842,171 B2 | 1/2005 | Richter et al. |
| 6,953,126 B2 | 10/2005 | Parker et al. |
| 6,984,680 B2 | 1/2006 | Quinn |
| 6,995,976 B2 | 2/2006 | Richardson |
| 7,017,243 B2 | 3/2006 | Carnevali |
| 7,031,148 B1 | 4/2006 | Lin |
| 7,054,042 B2 | 5/2006 | Holmes et al. |
| 7,068,783 B2 | 6/2006 | Peiker |
| 7,158,376 B2 | 1/2007 | Richardson et al. |
| 7,180,735 B2 | 2/2007 | Thomas et al. |
| 7,203,058 B2 | 4/2007 | Hong |
| 7,230,823 B2 | 6/2007 | Richardson et al. |
| 7,236,356 B2 | 6/2007 | Ulla et al. |
| 7,248,901 B2 | 7/2007 | Peiker |
| 7,257,429 B2 | 8/2007 | Kogan |
| 7,283,849 B2 | 10/2007 | Peiker |
| 7,311,526 B2 | 12/2007 | Rohrbach et al. |
| 7,312,984 B2 | 12/2007 | Richardson et al. |
| 7,320,450 B2 | 1/2008 | Carnevali |
| 7,329,128 B1 | 2/2008 | Awad |
| 7,351,066 B2 | 4/2008 | DiFonzo et al. |
| 7,430,674 B2 | 9/2008 | von Mueller et al. |
| 7,464,814 B2 | 12/2008 | Carnevali |
| 7,480,138 B2 | 1/2009 | Kogan et al. |
| 7,481,664 B1 | 1/2009 | Knoll et al. |
| 7,517,222 B2 | 4/2009 | Rohrbach et al. |
| 7,520,389 B2 | 4/2009 | Lalouette |
| 7,551,458 B2 | 6/2009 | Carnevali |
| 7,566,224 B2 | 7/2009 | Wu |
| 7,573,706 B2 | 8/2009 | Carnevali |
| 7,594,576 B2 | 9/2009 | Chen et al. |
| 7,609,512 B2 | 10/2009 | Richardson et al. |
| 7,612,997 B1 | 11/2009 | Diebel et al. |
| 7,625,212 B2 | 12/2009 | Du |
| 7,641,477 B2 | 1/2010 | DiFonzo et al. |
| 7,645,143 B2 | 1/2010 | Rohrbach et al. |
| 7,663,879 B2 | 2/2010 | Richardson et al. |
| 7,688,580 B2 | 3/2010 | Richardson et al. |
| 7,775,801 B2 | 8/2010 | Shiff et al. |
| 7,812,567 B2 | 10/2010 | Shen |
| 7,841,776 B2 | 11/2010 | DiFonzo et al. |
| 7,850,032 B2 | 12/2010 | Carnevali et al. |
| 7,855,529 B2 | 12/2010 | Liu |
| RE42,060 E | 1/2011 | Carnevali |
| 7,889,489 B2 | 2/2011 | Richardson et al. |
| 7,894,180 B2 | 2/2011 | Carnevali |
| 7,901,216 B2 | 3/2011 | Rohrbach et al. |
| 7,907,394 B2 | 3/2011 | Richardson et al. |
| 7,911,779 B1 | 3/2011 | Tarnoff |
| 7,946,868 B1 | 5/2011 | Chen |
| 7,946,891 B2 | 5/2011 | Peiker |
| 7,970,440 B2 | 6/2011 | Bury |
| RE42,581 E | 8/2011 | Carnevali |
| 7,997,554 B2 | 8/2011 | Carnevali |
| 8,054,042 B2 | 11/2011 | Griffin, Jr. et al. |
| 8,061,516 B2 | 11/2011 | Carnevali |
| 8,062,078 B2 | 11/2011 | Asai et al. |
| 8,074,951 B2 | 12/2011 | Carnevali |
| 8,080,975 B2 | 12/2011 | Bessa et al. |
| 8,087,939 B2 | 1/2012 | Rohrbach et al. |
| 8,099,138 B2 | 1/2012 | Piekarz |
| 8,167,624 B2 | 5/2012 | Hartlef et al. |
| 8,172,580 B1 | 5/2012 | Chen et al. |
| 8,177,178 B2 | 5/2012 | Carnevaali |
| 8,177,560 B2 | 5/2012 | Rohrbach et al. |
| 8,179,672 B2 | 5/2012 | Carnevali |
| 8,183,825 B2 | 5/2012 | Sa |
| 8,224,408 B2 | 7/2012 | Tomasini et al. |
| RE43,806 E | 11/2012 | Carnevali |
| 8,367,235 B2 | 2/2013 | Huang |
| 8,390,255 B1 | 3/2013 | Fathollahi |
| 8,405,974 B2 | 3/2013 | Sayavong |
| 8,414,312 B2 | 4/2013 | Hung et al. |
| 8,430,240 B2 | 4/2013 | Kim |
| 8,435,042 B2 | 5/2013 | Rohrbach et al. |
| 8,453,835 B2 | 6/2013 | So |
| 8,454,178 B2 | 6/2013 | Carnevali |
| 8,483,758 B2 | 7/2013 | Huang |
| 8,497,753 B2 | 7/2013 | DiFonzo et al. |

(56) References Cited

U.S. PATENT DOCUMENTS

| | | |
|---|---|---|
| 8,505,861 B2 | 8/2013 | Carnevali |
| 8,553,408 B2 | 10/2013 | Supran et al. |
| 8,560,014 B1 | 10/2013 | Hu et al. |
| 8,634,887 B2 | 1/2014 | Hu et al. |
| 8,639,288 B1 | 1/2014 | Friedman |
| 8,646,698 B2 | 2/2014 | Chen et al. |
| 8,690,582 B2 | 4/2014 | Rohrbach et al. |
| 8,702,316 B2 | 4/2014 | DiFonzo et al. |
| 8,729,854 B2 | 5/2014 | Tsai et al. |
| 8,760,311 B2 | 6/2014 | Heaton |
| 8,763,802 B2 | 7/2014 | Ellis-Brown |
| 8,801,441 B2 | 8/2014 | Zhang et al. |
| 8,825,123 B1 | 9/2014 | Gudino |
| 8,833,716 B2 | 9/2014 | Funk et al. |
| 8,873,233 B2 | 10/2014 | Reber et al. |
| 8,891,800 B1 | 11/2014 | Shaffer |
| 8,894,420 B2 | 11/2014 | Schichl et al. |
| 8,907,783 B2 | 12/2014 | Fish et al. |
| 8,911,246 B2 | 12/2014 | Carnevali |
| 8,929,065 B2 | 1/2015 | Williams |
| 8,950,717 B2 | 2/2015 | Chuang |
| 8,970,332 B2 | 3/2015 | DiFonzo et al. |
| 9,011,184 B2 | 4/2015 | Chen et al. |
| 9,026,187 B2 | 5/2015 | Huang |
| 9,036,343 B2 | 5/2015 | Carnevali |
| 9,071,060 B2 | 6/2015 | Fathollahi |
| 9,072,172 B2 | 6/2015 | Hsu |
| 9,112,304 B2 | 8/2015 | Rohrbach et al. |
| 9,123,935 B2 | 9/2015 | Huang |
| 9,147,966 B2 | 9/2015 | An |
| 9,172,781 B1 | 10/2015 | Goldstein |
| 9,195,279 B2 | 11/2015 | Carnevali et al. |
| 9,201,593 B2 | 12/2015 | Collopy et al. |
| 9,288,295 B2 | 3/2016 | Ivanovski et al. |
| 9,298,661 B2 | 3/2016 | Hamel et al. |
| 9,300,081 B2 | 3/2016 | Rudisill et al. |
| 9,331,444 B2 | 5/2016 | Carnevali |
| 9,356,267 B1 | 5/2016 | To et al. |
| 9,529,387 B2 | 12/2016 | Carnevali |
| 9,535,457 B1 | 1/2017 | Vier |
| 9,567,776 B2 | 2/2017 | Moock et al. |
| 9,591,113 B2 | 3/2017 | Filser et al. |
| 9,602,639 B2 | 3/2017 | Carnevali |
| 9,632,535 B2 | 4/2017 | Carnevali et al. |
| 9,647,474 B2 | 5/2017 | Fathollahi et al. |
| 9,706,026 B2 | 7/2017 | Carnevali |
| 9,760,116 B2 | 9/2017 | Wylie |
| 9,774,713 B2 | 9/2017 | Guerdrum et al. |
| 9,776,577 B2 | 10/2017 | Carnevali |
| 9,807,211 B2 | 10/2017 | Guerdrum et al. |
| 9,809,175 B2 | 11/2017 | Jonik et al. |
| 9,817,441 B1 | 11/2017 | Kuo |
| 9,831,904 B1 | 11/2017 | Carnevali |
| 9,898,041 B2 | 2/2018 | Blowers et al. |
| 9,924,005 B1 | 3/2018 | McElderry |
| 10,050,658 B2 | 8/2018 | Carnevali |
| 10,054,984 B2 | 8/2018 | Carnevali et al. |
| 10,148,104 B2 | 12/2018 | Sa |
| 10,172,246 B2 | 1/2019 | Apter |
| 10,238,003 B1 * | 3/2019 | Sachse .................. H05K 7/20 |
| 10,330,251 B2 | 6/2019 | Carnevali |
| 10,389,399 B2 | 8/2019 | Carnevali |
| 10,401,905 B2 | 9/2019 | Carnevali |
| 10,416,715 B1 | 9/2019 | Wade et al. |
| 10,454,515 B2 | 10/2019 | Carnevali |
| 10,485,312 B2 | 11/2019 | Rodriguez |
| 10,630,334 B2 | 4/2020 | Carnevali |
| 10,656,687 B2 | 5/2020 | Tashiro et al. |
| 10,666,309 B2 | 5/2020 | Carnevali |
| 10,707,632 B1 | 7/2020 | Yamamoto et al. |
| 10,714,953 B1 | 7/2020 | Solana et al. |
| 10,778,275 B2 | 9/2020 | Carnevali |
| 10,788,857 B2 | 9/2020 | Huang et al. |
| 10,812,643 B1 | 10/2020 | Carnevali et al. |
| 10,928,856 B1 | 2/2021 | Hamlin et al. |
| 10,976,777 B2 | 4/2021 | Pischel |
| 11,029,731 B1 | 6/2021 | Carnevali |
| 11,076,032 B1 | 7/2021 | Carnevali |
| 11,165,458 B2 | 11/2021 | Carnevali |
| 11,277,506 B2 | 3/2022 | Carnevali |
| 11,289,864 B2 | 3/2022 | Carnevali et al. |
| 11,489,350 B2 | 11/2022 | Carnevali |
| 11,522,379 B2 | 12/2022 | Lee et al. |
| 11,597,334 B2 | 3/2023 | Telesco et al. |
| 11,619,971 B1 | 4/2023 | Passe et al. |
| 11,652,326 B2 | 5/2023 | Carnevali |
| 2002/0009194 A1 | 1/2002 | Wong et al. |
| 2002/0032041 A1 | 3/2002 | Hirai et al. |
| 2002/0191782 A1 | 12/2002 | Beger et al. |
| 2003/0068986 A1 | 4/2003 | Oh |
| 2003/0116631 A1 | 6/2003 | Salvato et al. |
| 2004/0108348 A1 | 6/2004 | Barnes |
| 2004/0209489 A1 | 10/2004 | Clapper |
| 2005/0189354 A1 | 9/2005 | Heather et al. |
| 2006/0058073 A1 | 3/2006 | Kim |
| 2006/0175766 A1 | 8/2006 | Carnevali |
| 2007/0127204 A1 | 6/2007 | Muenzer et al. |
| 2008/0104301 A1 | 5/2008 | Assouad et al. |
| 2008/0149796 A1 | 6/2008 | Moscovitch |
| 2008/0273734 A1 | 11/2008 | Solland |
| 2009/0021903 A1 | 1/2009 | Chen et al. |
| 2009/0140113 A1 | 6/2009 | Carnevali |
| 2009/0160400 A1 | 6/2009 | Woud |
| 2009/0314400 A1 | 12/2009 | Liu |
| 2010/0013431 A1 | 1/2010 | Liu |
| 2011/0134601 A1 | 6/2011 | Sa |
| 2012/0018325 A1 | 1/2012 | Kim |
| 2012/0043235 A1 | 2/2012 | Klement |
| 2012/0088558 A1 | 4/2012 | Song |
| 2012/0118773 A1 | 5/2012 | Rayner |
| 2012/0161706 A1 | 6/2012 | Zhou |
| 2012/0211382 A1 | 8/2012 | Rayner |
| 2012/0250270 A1 | 10/2012 | Liu |
| 2012/0261306 A1 | 10/2012 | Richardson et al. |
| 2012/0298536 A1 | 11/2012 | Rauta et al. |
| 2013/0088188 A1 | 4/2013 | Romanenko |
| 2013/0092576 A1 | 4/2013 | Rayner |
| 2013/0106353 A1 | 5/2013 | Foster |
| 2013/0193006 A1 | 8/2013 | Bergreen et al. |
| 2013/0220841 A1 | 8/2013 | Yang |
| 2013/0222991 A1 | 8/2013 | McWilliams |
| 2013/0258573 A1 | 10/2013 | Muday et al. |
| 2013/0273752 A1 | 10/2013 | Rudisill et al. |
| 2013/0273983 A1 | 10/2013 | Hsu |
| 2013/0322568 A1 | 12/2013 | Pais et al. |
| 2013/0331156 A1 | 12/2013 | Lui |
| 2013/0334071 A1 | 12/2013 | Carnevali |
| 2014/0042285 A1 | 2/2014 | Carnevali |
| 2014/0055928 A1 | 2/2014 | Lee |
| 2014/0059264 A1 | 2/2014 | Sudak |
| 2014/0070774 A1 | 3/2014 | Terlizzi et al. |
| 2014/0099526 A1 | 4/2014 | Powell et al. |
| 2014/0168885 A1 | 6/2014 | Williams |
| 2014/0293536 A1 * | 10/2014 | Bramah ................ G06F 1/1632 |
| | | 361/679.55 |
| 2014/0347000 A1 | 11/2014 | Hamann et al. |
| 2014/0363988 A1 | 12/2014 | An |
| 2015/0055289 A1 | 2/2015 | Chang et al. |
| 2015/0146401 A1 | 5/2015 | Su et al. |
| 2015/0189780 A1 | 7/2015 | Su et al. |
| 2016/0065702 A1 | 3/2016 | Carnevali |
| 2016/0231779 A1 | 8/2016 | Kaneko et al. |
| 2016/0309010 A1 | 10/2016 | Carnevali |
| 2017/0054312 A1 | 2/2017 | Kuchynka et al. |
| 2017/0227987 A1 | 8/2017 | Carnevali et al. |
| 2018/0279809 A1 | 10/2018 | Regan et al. |
| 2018/0314296 A1 | 11/2018 | Evns, V et al. |
| 2019/0267825 A1 | 8/2019 | Chien |
| 2020/0195763 A1 | 6/2020 | Ellis |
| 2020/0197563 A1 | 6/2020 | Shen et al. |
| 2020/0326955 A1 | 10/2020 | Adiletta et al. |
| 2020/0330037 A1 | 10/2020 | Al-Ali et al. |
| 2020/0371555 A1 | 11/2020 | Huang et al. |
| 2021/0048848 A1 | 2/2021 | Pischel |

(56) References Cited

U.S. PATENT DOCUMENTS

| | | |
|---|---|---|
| 2021/0194256 A1 | 6/2021 | Carnevali |
| 2021/0391678 A1 | 12/2021 | Carnevali |
| 2021/0392773 A1 | 12/2021 | Carnevali |
| 2022/0026951 A1 | 1/2022 | Wood, III et al. |
| 2022/0066505 A1 | 3/2022 | Lu et al. |
| 2022/0253097 A1 | 8/2022 | Carnevali et al. |
| 2022/0352682 A1 | 11/2022 | Carnevali |
| 2023/0039167 A1 | 2/2023 | Kamepalli et al. |
| 2023/0045485 A1 | 2/2023 | Carnevali et al. |
| 2023/0341897 A1 | 10/2023 | Carnevali et al. |
| 2024/0399976 A1 | 12/2024 | Carnevali et al. |
| 2024/0403251 A1 | 12/2024 | Anderson |

FOREIGN PATENT DOCUMENTS

| | | |
|---|---|---|
| CN | 202268924 | 6/2012 |
| CN | 202565335 | 11/2012 |
| CN | 204334055 | 5/2015 |
| CN | 204334674 | 5/2015 |
| CN | 204408423 | 6/2015 |
| JP | 2004-349969 | 12/2004 |
| JP | 2014-75327 | 4/2014 |
| KR | 20-0265673 | 2/2002 |
| KR | 10-1078214 | 11/2011 |
| TW | 2003TW531119 | 5/2003 |
| TW | M422808 | 2/2012 |
| WO | 2012/052751 | 4/2012 |
| WO | 2013/081222 | 6/2013 |
| WO | 2014/010781 A1 | 1/2014 |
| WO | 2014/054426 | 4/2014 |
| WO | 2015/022675 | 2/2015 |

OTHER PUBLICATIONS

U.S. Appl. No. 18/612,977, filed Mar. 21, 2024.
U.S. Appl. No. 18/404,795, filed Jan. 4, 2024.
U.S. Appl. No. 18/233,218, filed Aug. 11, 2023.
U.S. Appl. No. 18/614,482, filed Mar. 22, 2024.
U.S. Appl. No. 18/638,430, filed Apr. 17, 2024.
Otterbox Product directory, 20 pages of product description of Otter Box waterproof boxes retrieved from web site at: www.otterbox.com Dated Sep. 2, 2005. Otter Products, LLC, Bldg. 1 Old-Town Square, Suite 303, Fort Collins, CO 80524 Phone: 1-888-695-8820, 970-493-8446; Facsimile: 1-888-695-8827, 970-493-1755.
Officeonthego.com, 3 pages of product description of Magnifico® Plus screen magnifier product information retrieved from web site at: www.officeonthego.com.
2 pages of product information for Armor 1600 and Armor 1601 waterproof, dustproof and airtight protective cases.
2 pages Otterrox 4600 Tablet PC Case protective cases product information retrieved from web site at: www.otterbox.com.
Jason Poel Smith: "How to Transplant RFID Chips", Sep. 3, 2013 (Sep. 3, 2013), XP55492991, Retrieved from the Internet: URL: http://www.instructables.com/id/How-to-Transplant-RFID-Chips/ [retrieved on Jul. 17, 2018].
Battery Charging Specification (Including errata and ECNs through Mar. 15, 2012); Revision 1.2, Mar. 15, 2012. 72 pages.

\* cited by examiner

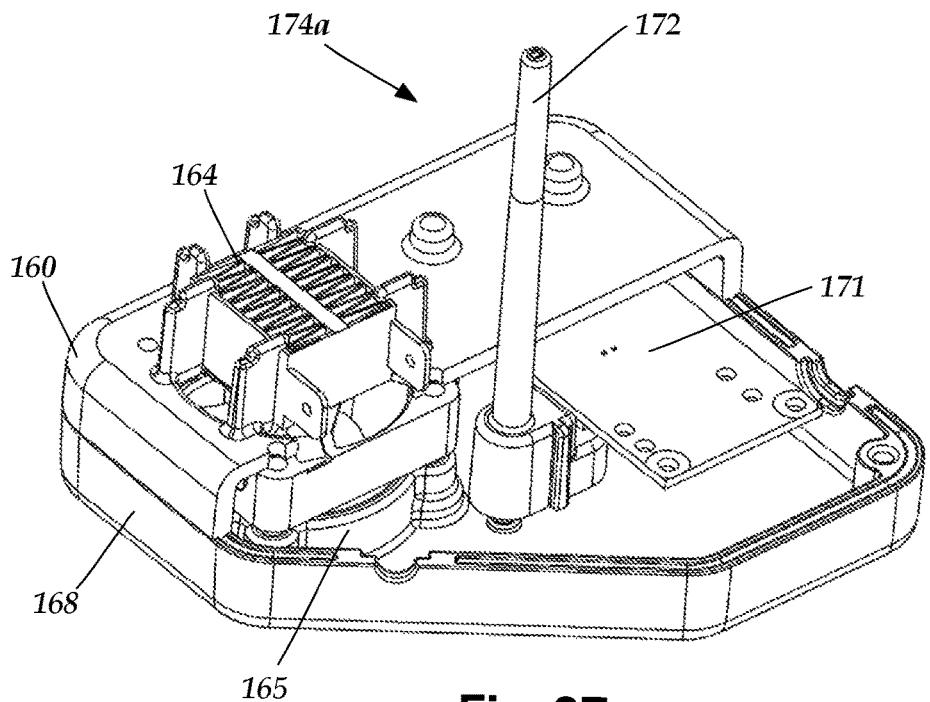
Fig. 2E
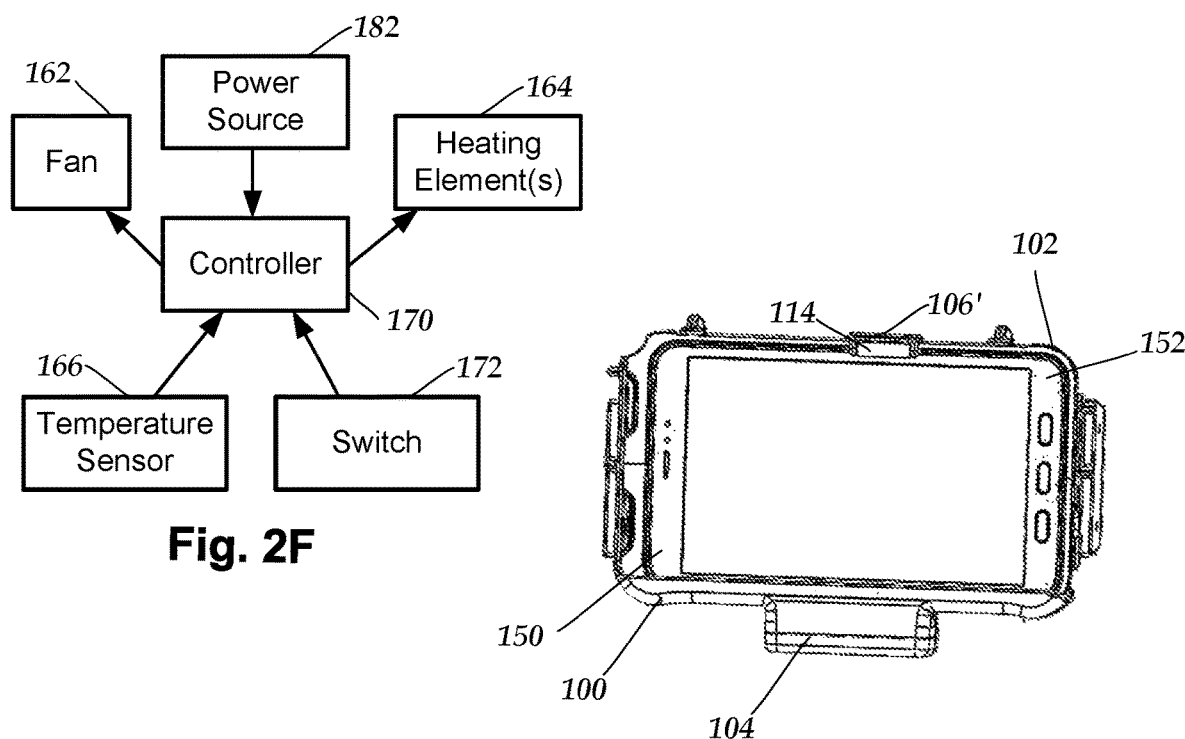
Fig. 2F
Fig. 3

HEATING MODULE FOR ELECTRONIC DEVICE DOCK AND METHODS OF MAKING AND USING

The present invention is directed to heating module for a dock for an electronic device. The present invention is also directed to a dock for an electronic device with a heating module.

BACKGROUND

Electronic devices, such as tablets, mobile phones, personal data assistants, or the like, are sensitive to temperature. When the ambient or device temperature is too hot or cold, an electronic device may shut down, operate slowly, or fail to perform. The ideal operating temperature range of electronic devices often fall outside of the temperature range in environments in which the electronic devices are intended to be used. For example, such electronic devices may be used in ambient or device temperatures that are at or below 0° C. (32° F.) or at or above 37° C. (approximately 100° F.), for example, in a vehicle sitting in the sun. These temperatures are typically outside the recommended operating temperature range of most electronic devices. An electronic device may operate at such temperatures for extended periods of time.

BRIEF SUMMARY

One embodiment is a dock for an electronic device. The dock includes a base configured to fit over at least a portion of a back surface of the electronic device when the electronic device is received in the dock, the base including a back surface and defining a first opening through the base; a tray extending from the base for receiving one side of the electronic device; and a heater module coupled, or coupleable, to the back surface of the base over the first opening. The heater module includes a fan to draw air to generate an air flow through the first opening of the base, a heating element to heat the drawn air, a temperature sensor coupled, or coupleable, to the base to monitor a temperature of the dock, the electronic device, or the heated air, and a processor coupled to the fan, the heating element, and the temperature sensor, wherein the processor is configured to turn the fan and the heating element on or off in response to a temperature monitored by the temperature sensor.

In at least some embodiments, the dock further includes a switch, coupled to the processor, to indicate when the electronic device is received in the dock, wherein the processor is configured to only turn on the heating element and the fan when the switch indicates that the electronic device is received in the dock. In at least some embodiments, the switch is configured to engage the electronic device when the heater module is coupled to the back surface of the base and the electronic device is received in the dock.

In at least some embodiments, the temperature sensor includes a thermistor. In at least some embodiments, the base includes at least one second opening through the base for allowing air flow out of the dock including when the fan of the heater module is in operation.

In at least some embodiments, the processor is configured to turn on the fan and the heating element when the temperature sensor indicates a temperature at or below a predefined on-temperature threshold that is in a range of −5 to 5 degrees Celsius. In at least some embodiments, the processor is configured to turn off the fan and the heating element when the temperature sensor indicates a temperature at or above a predefined off-temperature threshold that is in a range of −5 to 5 degrees Celsius. In at least some embodiments, the predefined on-temperature threshold is different from the predefined off-temperature threshold.

In at least some embodiments, the heater module includes a power cord electrically coupled to the fan, heating element, the temperature sensor, and the processor. In at least some embodiments, the heater module is configured for hardwiring to a power source.

Another embodiment is a system that includes any of the docks described above and the electronic device. In at least some embodiments, the system further includes a vehicle, wherein the dock is disposed within the vehicle and the heater module is electrically coupled, or coupleable, to the vehicle.

A further embodiment is a heater module configured for coupling to a dock for receiving an electronic device. The heater module includes a fan to draw air to generate an air flow through an opening in the dock; a heating element to heat the drawn air; a temperature sensor coupleable to the dock to monitor a temperature of the dock, the electronic device, or the heated air; and a processor coupled to the fan, the heating element, and the temperature sensor, wherein the processor is configured to turn the fan and the heating element on or off in response to the temperature monitored by the temperature sensor.

In at least some embodiments, the heater module further includes a switch, coupled to the processor, to identify when the electronic device is received in the dock, wherein the processor is configured to only turn on the heating element and the fan when the switch identifies that the electronic device is received in the dock. In at least some embodiments, the processor is configured to turn on the fan and the heating element when the temperature sensor indicates a temperature at or below a predefined on-temperature threshold that is in a range of −5 to 5 degrees Celsius.

Another embodiment is a method for cooling or heating an electronic device disposed in any of the docks described above. The method includes providing the dock with the heater module coupled to base of the dock; receiving the electronic device in the dock; and heating the dock and electronic device using air heated by the heater module. In at least some embodiments, the heating includes turning on the fan and the heating element when the temperature sensor indicates a temperature at or below a predefined on-temperature threshold. In at least some embodiments, the method further includes turning off the fan and the heating element when the temperature sensor indicates a temperature at or above a predefined off-temperature threshold.

In at least some embodiments, the heater module further includes a switch, coupled to the processor, to identify when the electronic device is received in the dock, wherein the heating includes only turning on the heating element and the fan when the switch identifies that the electronic device is received in the dock. In at least some embodiments, the receiving includes engaging the switch as the electronic device is received in the dock.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein:

FIG. 2E is a schematic perspective front view of the heater module of FIG. 2B with a portion of the housing removed, according to the invention;

FIG. 2F is a schematic block diagram of operative elements of the heater module of FIG. 2B connected to a power source, according to the invention; and FIG. 3 is a schematic front view of another embodiment of a dock with an electronic device disposed in the dock, according to the invention.

DETAILED DESCRIPTION

The present invention is directed to heating module for a dock for an electronic device. The present invention is also directed to a dock for an electronic device with a heating module.

Figure 1A:
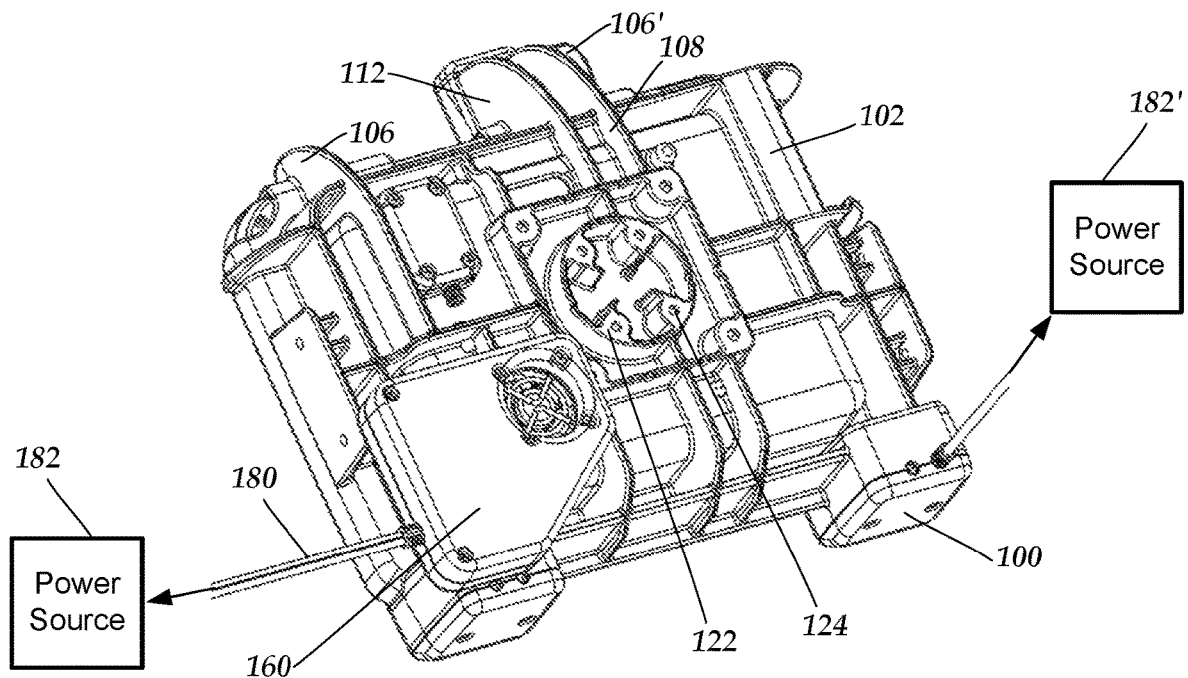
FIG. 1A is a schematic perspective back view of an embodiment of a dock and a heater module, according to the invention.
Figure 1B:
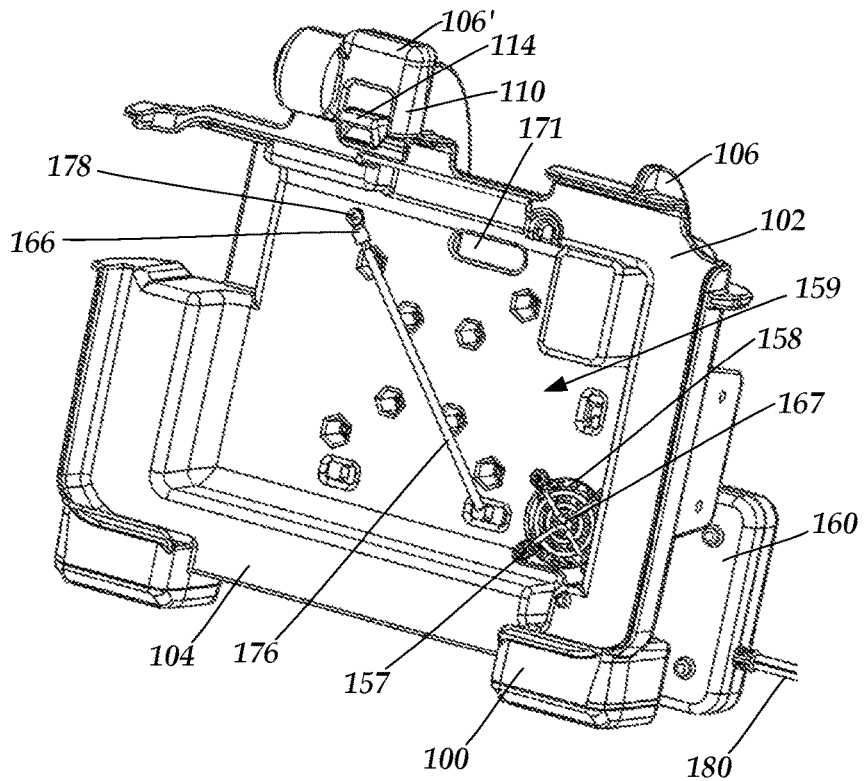
FIG. 1B is a schematic perspective front view of the dock and heater module of FIG. 1A, according to the invention.
Figure 2A:
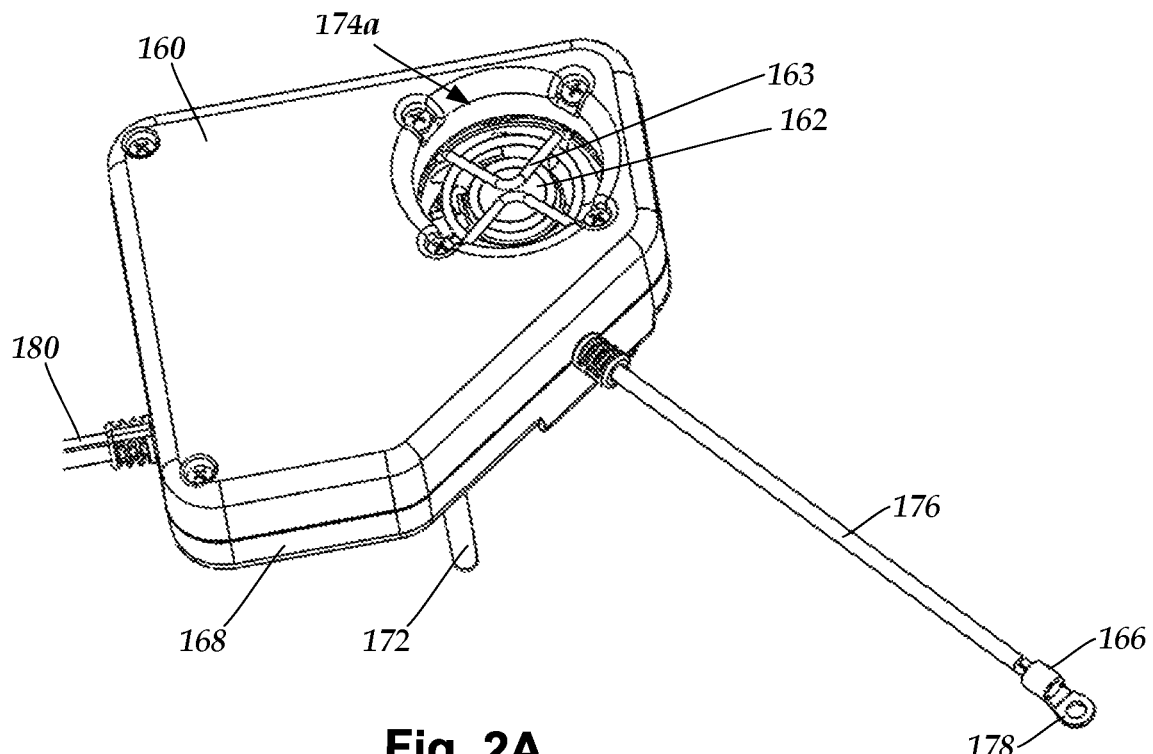
FIG. 2A is a schematic perspective back view of one embodiment of a heater module, according to the invention.
Figure 2B:
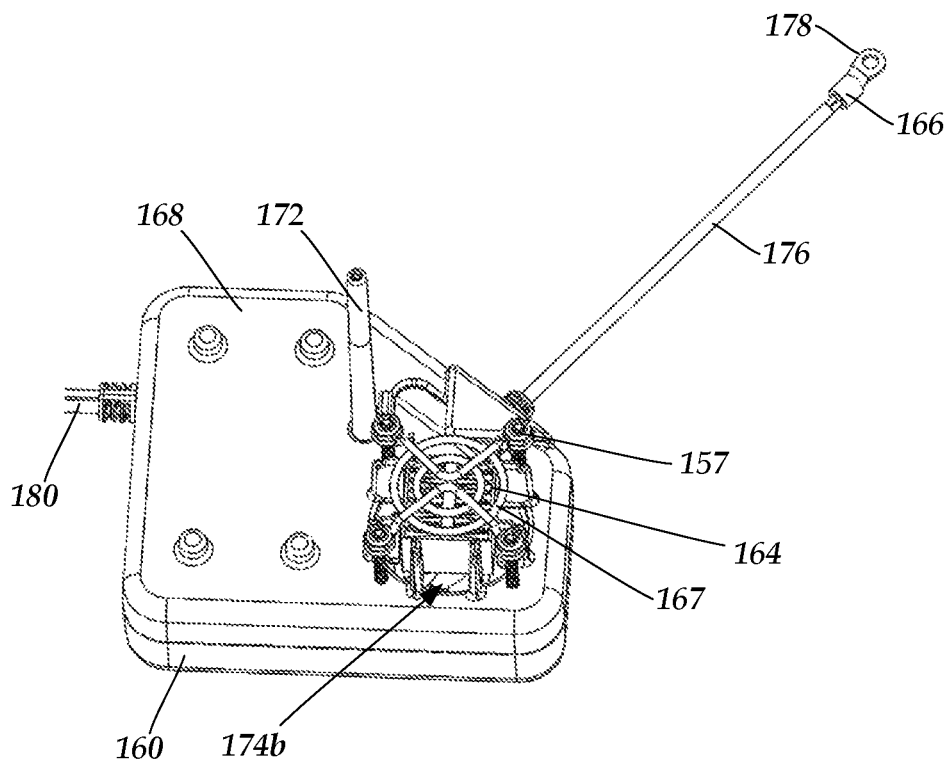
FIG. 2B is a schematic perspective front view of the heater module of FIG. 2B, according to the invention.
Figure 2C:
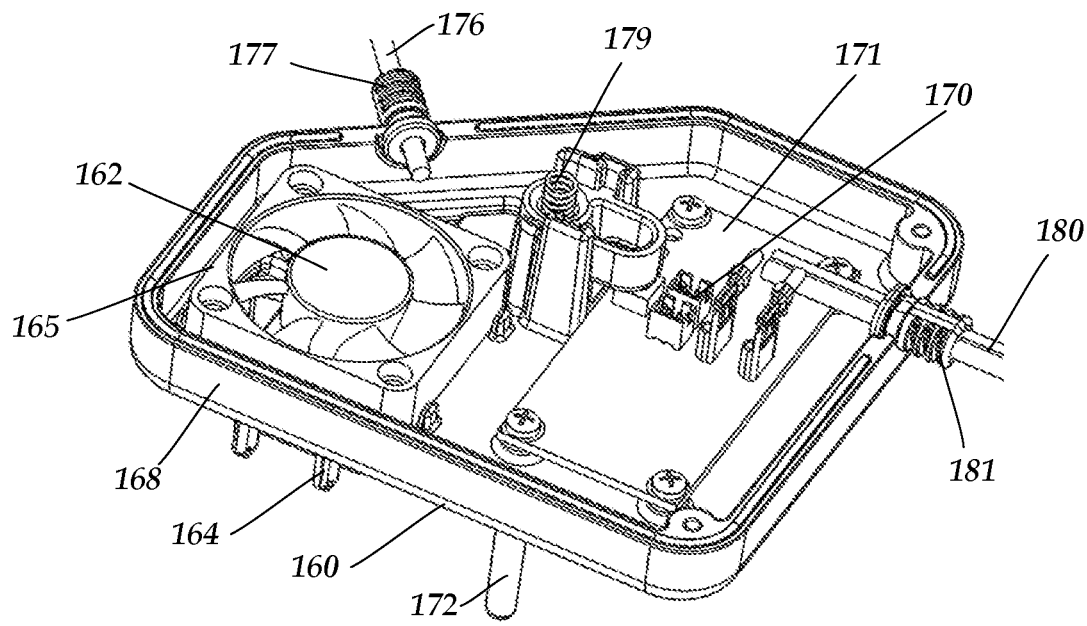
FIG. 2C is a schematic perspective back view of the interior of the heater module of FIG. 2B, according to the invention.
Figure 2D:
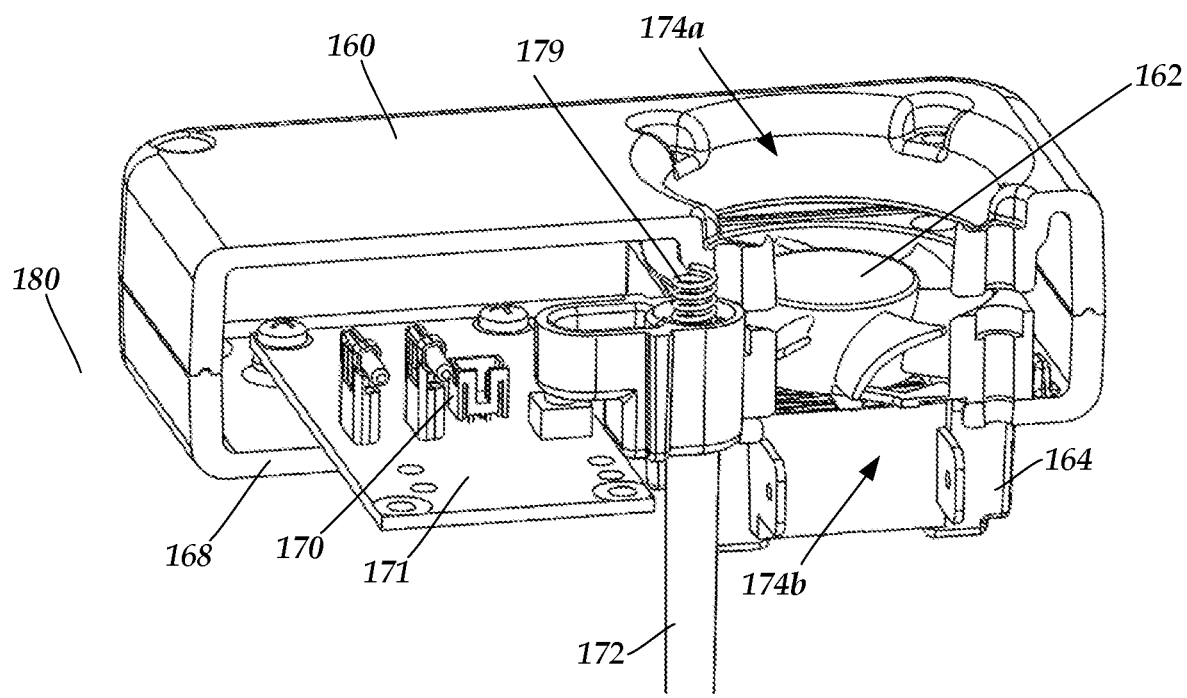
FIG. 2D is a schematic perspective sectional side view of a portion of the heater module of FIG. 2B, according to the invention.

To heat or cool an electronic device, a dock can include a heater module. As illustrated in FIGS. 1A and 1B, one embodiment of a dock 100 includes a base 102, a tray 104 extending from a base 102, and a heater module 160 attached, or attachable, to the base. The tray 104 receives one side of an electronic device 150 (FIG. 3), such as a mobile device (for example, a mobile phone, tablet, personal data assistant, or the like) or a laptop. Examples of docks that can be modified to include an air flow arrangement can be found in, for example, U.S. Pat. Nos. 7,573,706; 7,894,180; 8,179,672; 9,036,343; 9,831,904; 11,029,731; 11,076,032; 11,277,506; 11,489,350; and 11,652,326 and U.S. Patent Application Publications Nos. 2022/0253097 and 2023/0045485, all of which are incorporated by reference in their entireties.

In at least some embodiments, an electronic device 150, such as a mobile device, may be disposed within a cover 152. In at least some embodiments, the dock 102 includes one or more contacts disposed in the tray 104 and configured to couple to contacts on the cover 152 or electronic device 150. Examples of covers 152 for an electronic device 150 are described in U.S. Pat. Nos. 9,195,279; 9,331,444; 9,529,387; 9,602,639; 9,632,535; 9,706,026; 10,389,399; 10,050,658; 10,054,984; 10,454,515; 10,630,334; 10,666,309; 10,778,275 10,812,643; 11,029,731; 11,076,032; 11,165,458; 11, 277,506; and 11,289,864 and U.S. Patent Applications Publication Nos. 2021/0391678 and 2021/0392773, all of which are incorporated herein by reference in their entireties.

In at least some embodiments, the dock 100 also includes at least one attachment arm 106, 106' extending from the base 102 for attaching the dock to the electronic device 150. Each attachment arm 106, 106' has a back engagement portion 108, a front engagement portion 110, and a width portion 112 extending between the back and front engagement portions. In at least some embodiments, the back and front engagement portions 108, 110 are arranged to fit snugly on the electronic device 150 disposed therein to retain the electronic device in the dock 100. In at least some embodiments, the front engagement portion 110 of an attachment arm 106' includes a roller 114 which can roll on an axle held by two legs to facilitate retention of the electronic device 150 within the dock 100.

In at least some embodiments, the dock 100 can have attached, or attachable, to one or more accessories, such as a mount. The mount can be attached to a mounting arrangement 122 on the dock 100 which includes multiple attachment apertures 124 for receiving a fastener to attach the mount to the mounting arrangement. Non-limiting examples of mounts and mounting devices can be found at, for example, U.S. Pat. Nos. 5,845,885; 6,561,476; 7,320,50; 7,997,554; 8,454,178; 8,505,861; 9,831,904; RE42,060; RE42,581; and RE43,806, all of which are incorporated herein by reference in their entireties.

FIGS. 2A to 2F illustrate one embodiment of the heater module 160. This embodiment of the heater module 160 includes a fan 162, at least one heating element 164, a temperature sensor 166, a housing 168, a controller 170, and an optional switch 172. In at least some embodiments, the fan 162 is disposed in a fan housing 165 which is attached or otherwise secured to the housing 168. In at least some embodiments, the fan 162 is a 12-VDC axial cooling fan. The controller 170 controls operation of the fan 162 and heating element(s) 164 and is coupled to the temperature sensor 166. In at least some embodiments, the controller 170 (and, optionally, other components) are disposed on a substrate 171.

The heater module 160 can include a cord 180 for coupling to a power source 182 or to the dock 100 (for example, in some embodiments, in which the dock is coupled to a power source 182'). In at least some embodiments, the cord 180 includes a connector for connecting to a power source. In at least some embodiments, the cord 180 is arranged for hardwiring to a power source. In at least some embodiments, the cord includes a strain relief element 181 provided at the junction with the housing 168.

The housing 168 includes opposing openings 174a, 174b. The fan 162 is disposed within the housing 168 between the opposing openings 174a, 174b. In at least some embodiments, a grill 163 is disposed over the opening 174a to protect the fan and user. In at least some embodiments (including the illustrated embodiment), the heating element(s) 164 is/are disposed outside the housing 168 over the opening 174b. In other embodiments, one or more of the heating element(s) 164 is/are disposed within the housing 168 between the fan 162 and the opening 174b. In at least some embodiments, one or more of the heating element(s) 164 is/are disposed over the opening 174a to heat air drawn by the fan 162 (although this arrangement may be less suitable due to the possibility of user contact with the heating element(s)).

Air is pulled through the opening 174a by the fan 162. The air then passes through the opening 174b and is heated by the heating element(s) 164 (or in other embodiments with different positioning of the heating element(s), heated prior to passing through the opening 174b or through the opening 174a).

The base 102 of the dock 100 includes an opening 158 (FIG. 1B) with the heater module 160 disposed over this opening 158 the base so that the heated air passes through the opening 158 into the cavity 159 of the dock and between the base 102 and the electronic device 150. In at least some embodiments, the base 102 of the dock 100 includes one or more openings 161 for exit of air from the cavity 159.

In at least some embodiments, a grill 167 is disposed over the opening 158. In at least some embodiments, the heater module 160 includes fasteners 157, such as screws, bolts, pins, or the like, that attach the heater module to the base 102 of the dock 100. The base 102 and heater module include openings for passage of the fasteners and, at least in some embodiments, the openings are threaded for attachment of a screw. In at least some embodiments, a grill 167 is disposed over the opening 158 in the base 102 of the dock 100. In at least some embodiments, the fasteners 157 also fasten the grill 167 to the base 102.

In at least some embodiments, the heater module 160 includes a temperature sensor 166, such as a thermistor or any other suitable temperature sensor. In the illustrated embodiment, the temperature sensor 166 is disposed at a distal end portion of a cable 176 with a fastening arrangement 178. In the illustrated embodiment, the temperature sensor 166 is attached to the base 102 using the fastening arrangement 178. Any suitable fastening arrangement 178 can be used including, as illustrated in the Figures, a loop that can be attached to the base 102 using a screw or other fastener, where the screw or other fastener is provided with the heater module 160 or with the dock 100. The length of the cable 176 can be selected to position the temperature sensor 166 at a selected position on the base 102 of the dock 100. In at least some embodiments, the temperature sensor 166 is positioned relatively far from the heater module 160 to measure a temperature relatively far from the heater module. In at least some embodiments, the cable 176 includes a strain relief element 177 at the junction of the cable with the housing 168.

The temperature sensor 166 is coupled to the controller 170 which makes temperature measurements to determine when to turn on or turn off the fan 162 and heating element(s) 164. In at least some embodiments, there is an on-threshold temperature and an off-threshold temperature, which may be the same temperature or may be different temperatures. In at least some embodiments, the off-threshold temperature is higher than the on-threshold temperature. When the heating element(s) 164 and fan 162 are turned off and the temperature measure is at or below the on-threshold temperature, then the controller 170 turns on the heating element(s) 164 and the fan 162. When the heating element(s) 164 and fan 162 are turned on and the temperature measure is at or above the off-threshold temperature, then the controller 170 turns off the heating element(s) 164 and the fan 162. In at least some embodiments, the heating element(s) 164 may be turned off before the fan 162 to facilitate cooling the heating element(s). In at least some embodiments, one or both of the off-threshold temperature and the on-threshold temperature is selected to be a temperature in a range of −5 to +5 degrees Celsius (e.g., 23 to 41 degrees fahrenheit) or −3 to +3 degrees Celsius (e.g., 27 to 37 degrees fahrenheit) or to be 0 degrees Celsius (e.g., 32 degrees fahrenheit).

In at least some embodiments, the heater module 160 includes a switch 172 that identifies when the electronic device 150 is in the dock 100. In the illustrated embodiment, the switch 172 is a plunger switch which engages the electronic device 150 when the electronic device is inserted into the dock. In at least some embodiments, the switch 172 is biased to an open position by, for example, a spring 179 or other biasing element. Any other suitable type of switch 172 can be used including, but not limited to, a manual switch on the heater module 160 or dock 100 that a user can operate or a software switch as part of the dock 100, heater module 160; electronic device 150 that a user can operate through the electronic device; or the like or any other suitable switch arrangement.

In operation, when the switch 172 indicates that the electronic device 150 is inserted into the dock (e.g., the switch 172 is in a closed position), the controller 170 operates the fan 162 and heating element(s) 164 to provided heated air as needed. When the switch 172 indicates that no electronic device 150, the controller 170 prevents operation of the fan 162 and the heating element 164.

The above specification provides a description of the manufacture and use of the invention. Since many embodiments of the invention can be made without departing from the spirit and scope of the invention, the invention also resides in the claims hereinafter appended.

What is claimed as new and desired to be protected by Letters Patent of the United States is:

1. A dock for an electronic device, the dock comprising:
   a base configured to fit over at least a portion of a back surface of the electronic device when the electronic device is received in the dock, the base comprising a back surface and defining a first opening through the base;
   a tray extending from the base for receiving one side of the electronic device; and
   a heater module coupled, or coupleable, to the back surface of the base over the first opening, the heater module comprising
      a fan to draw air and generate an air flow through the first opening of the base,
      a heating element to heat the drawn air,
      a temperature sensor coupled, or coupleable, to the base to monitor a temperature of the dock, the electronic device, or the heated air, and
      a processor coupled to the fan, the heating element, and the temperature sensor, wherein the processor is configured to turn the fan and the heating element on or off in response to a temperature monitored by the temperature sensor.

2. The dock of claim 1, further comprising a switch, coupled to the processor, to indicate when the electronic device is received in the dock, wherein the processor is configured to only turn on the heating element and the fan when the switch indicates that the electronic device is received in the dock.

3. The dock of claim 2, wherein the switch is configured to engage the electronic device when the heater module is coupled to the back surface of the base and the electronic device is received in the dock.

4. The dock of claim 1, wherein the temperature sensor comprises a thermistor.

5. The dock of claim 1, wherein the base comprises at least one second opening through the base for allowing air flow out of the dock including when the fan of the heater module is in operation.

6. The dock of claim 1, wherein the processor is configured to turn on the fan and the heating element when the temperature sensor indicates a temperature at or below a predefined on-temperature threshold that is in a range of −5 to 5 degrees Celsius.

7. The dock of claim 6, wherein the processor is configured to turn off the fan and the heating element when the temperature sensor indicates a temperature at or above a predefined off-temperature threshold that is in a range of −5 to 5 degrees Celsius.

8. The dock of claim 7, wherein the predefined on-temperature threshold is different from the predefined off-temperature threshold.

9. The dock of claim 1, wherein the heater module comprises a power cord electrically coupled to the fan, heating element, the temperature sensor, and the processor.

10. The dock of claim 1, wherein the heater module is configured for hardwiring to a power source.

11. A system comprising:
the dock of claim 1; and
the electronic device.

12. The system of claim 11, further comprising a vehicle, wherein the dock is disposed within the vehicle and the heater module is electrically coupled, or coupleable, to the vehicle.

13. A heater module configured for coupling to a dock for receiving an electronic device, the heater module comprising:
a fan to draw air and generate an air flow through a first opening of a base of the dock;
a heating element to heat the drawn air;
a temperature sensor coupleable to the dock to monitor a temperature of the dock, the electronic device, or the heated air; and
a processor coupled to the fan, the heating element, and the temperature sensor, wherein the processor is configured to turn the fan and the heating element on or off in response to the temperature monitored by the temperature sensor.

14. The heater module of claim 13, further comprising a switch, coupled to the processor, to identify when the electronic device is received in the dock, wherein the processor is configured to only turn on the heating element and the fan when the switch identifies that the electronic device is received in the dock.

15. The heater module of claim 13, wherein the processor is configured to turn on the fan and the heating element when the temperature sensor indicates a temperature at or below a predefined on-temperature threshold that is in a range of −5 to 5 degrees Celsius.

16. A method for cooling or heating an electronic device disposed in the dock of claim 1, the method comprising:
providing the dock with the heater module coupled to base of the dock;
receiving the electronic device in the dock; and
heating the dock and electronic device using air heated by the heater module.

17. The method of claim 16, wherein the heating comprises turning on the fan and the heating element when the temperature sensor indicates a temperature at or below a predefined on-temperature threshold.

18. The method of claim 17, further comprising turning off the fan and the heating element when the temperature sensor indicates a temperature at or above a predefined off-temperature threshold.

19. The method of claim 16, wherein the heater module further comprises a switch, coupled to the processor, to identify when the electronic device is received in the dock, wherein the heating comprises only turning on the heating element and the fan when the switch identifies that the electronic device is received in the dock.

20. The method of claim 19, wherein the receiving comprises engaging the switch as the electronic device is received in the dock.

\* \* \* \* \*